United States Patent
Boyer et al.

(10) Patent No.: US 7,049,859 B2
(45) Date of Patent: May 23, 2006

(54) VARIABLE THRESHOLD COMPARATOR INTERFACE CIRCUIT

(75) Inventors: John W. Boyer, Westfield, IN (US); Daniel R. Harshbarger, Kokomo, IN (US)

(73) Assignee: Delphi Technologies, Inc., Troy, MI (US)

(*) Notice: Subject to any disclaimer, the term of this patent is extended or adjusted under 35 U.S.C. 154(b) by 31 days.

(21) Appl. No.: 10/740,333

(22) Filed: Dec. 18, 2003

(65) Prior Publication Data
US 2005/0134324 A1 Jun. 23, 2005

(51) Int. Cl.
*H03K 5/153* (2006.01)
(52) U.S. Cl. .................................... 327/73; 327/80
(58) Field of Classification Search ............ 327/50–56, 327/63, 67, 72–80, 37, 306–311
See application file for complete search history.

(56) References Cited

U.S. PATENT DOCUMENTS

| | | | | |
|---|---|---|---|---|
| 3,569,739 A | * | 3/1971 | Stolman | 327/88 |
| 3,725,795 A | * | 4/1973 | Mesenhimer | 327/74 |
| 3,760,195 A | * | 9/1973 | Szpakowski | 327/89 |
| 3,991,733 A | * | 11/1976 | Harris | 123/618 |
| 3,996,531 A | * | 12/1976 | Wittlinger | 331/143 |
| 4,153,850 A | * | 5/1979 | Boyer | 327/79 |
| 4,847,577 A | * | 7/1989 | Gerhart et al. | 327/37 |
| 4,926,068 A | * | 5/1990 | Fujita | 327/72 |
| 5,548,242 A | * | 8/1996 | Yasuda et al. | 327/559 |

* cited by examiner

*Primary Examiner*—Minh Nguyen
(74) *Attorney, Agent, or Firm*—Stefan V. Chmielewski

(57) ABSTRACT

A signal processing circuit includes a comparator having a fixed and a variable reference input for detection of a positive quasi-sinusoidal waveform pulse. A signal detection circuit includes a low pass input filter, a voltage input clamp, a variable detection threshold, and a zero crossing detector. The circuit produces an approximately square wave output substantially coinciding with the positive pulse of the quasi-sinusoidal waveform received, from a variable reluctance sensor. The circuit has a positive to negative zero crossing detector armed by a variable threshold of the positive quasi-sinusoidal pulse, thus providing variable noise immunity and a fixed phase relationship between the input and output signal for an input signal having a variable amplitude.

17 Claims, 5 Drawing Sheets

VARIABLE THRESHOLD COMPARATOR INTERFACE CIRCUIT

TECHNICAL BACKGROUND

The present invention relates to a signal processing circuit, and more particularly to a signal detection circuit for automobile applications.

BACKGROUND OF THE INVENTION

Variable reluctance (VR) sensors are used in a number of automotive and nonautomotive applications. Automotive applications include engine speed and position sensing for ignition and transmission systems, and wheel speed sensing for anti-lock brake and traction control systems.

A VR sensor includes an electromagnetic device having a coil, for example a winding of wire wrapped around a permanent magnet. The sensor is positioned near a rotating wheel having one or more ferrous notches or teeth. Rotation of the notches past the sensor coil provides a magnetic flux that creates a quasi-sinusoidal waveform in the sensor coil. The positive to negative zero crossing portion of the waveform typically is related to the center of the notch or tooth passing by the sensor tip. Sensing the zero crossing of the VR sensor signal provides the position of the rotating wheel. For example, a VR sensor can provide feedback for variable cam timing and, because the crankshaft rotates twice for every revolution of the camshaft, detection of which of the two crankshaft revolutions the crankshaft is on.

VR sensors provide good reliability under the harsh mechanical vibration and high-temperature environment of automotive engines. The sensor is self-exciting because of the ferrous notch or tooth associated with the sensor. The VR sensor output signal amplitude is proportional to the speed of the rotating sensing wheel, therefore detection circuits designed for the higher amplitude signal associated with high speed wheel rotation may not detect a lower amplitude signal associated with lower speed wheel rotation.

The signal produced by a VR sensor associated with engine speed and used as a reference signal for ignition timing varies in amplitude and noise content for various engine conditions. For example, a low signal amplitude is produced at minimum cranking speed and a high signal amplitude is produced at high engine speeds. Additionally, upon cranking the engine to start it, upwards of 300 amperes flowing through adjacent wiring harnesses may produce significant signal noise. The signal noise can produce false engine speed and position indications in the VR sensor signal.

In one known ignition timing application, signal detection circuit 10, a block diagram of which is shown in FIG. 5, detects the positive half of the VR sensor signal, "arming" circuit 10 to trigger an output upon the zero crossing portion of the VR signal. Detection circuit 10 requires at least three amplifiers, three comparators, and 37 discrete electronic components in order to process the input signal and provide an approximately square wave output signal suitable for output to an ignition system. Discrete components are defined as nonintegrated circuits, for example, but not limited to, resistors, diodes, capacitors, and inductors.

Signal detection circuit 10 includes zero-crossing differential amplifier 12, adaptive threshold amplifier 14, reference voltage source amplifier 15, adaptive threshold comparator 16, zero crossing comparator 17, and output comparator 18. Each of the above-listed devices also includes various associated discrete components. Zero crossing amplifier 12 is a differential amplifier that detects the positive-to-negative zero crossing transition and attenuates the unwanted negative pulse of the input signal. The output of zero crossing amplifier 12 is provided to adaptive threshold amplifier 14, adaptive threshold comparator 16, and zero crossing comparator 17. Reference voltage source amplifier 15 provides a fixed voltage reference of approximately 0.8 volts that is provided to adaptive threshold amplifier 14 and zero crossing comparator 17. Adaptive threshold amplifier 14 provides a variable voltage threshold reference that increases at higher input signal frequencies. The output of adaptive threshold amplifier 14 and zero crossing amplifier 12 is received by adaptive threshold comparator 16 to detect a positive going signal threshold. Zero crossing comparator 17 receives the input from zero crossing amplifier 12 and reference voltage source amplifier 15 and provides a negative-to-positive zero crossing detection. The outputs of adaptive threshold comparator 16 and zero crossing comparator 17 are coupled to output comparator 18, which provides an approximately square output pulse associated with the quasi-sinusoidal positive waveform pulses of the input signal.

While known VR signal detection circuit 10 is adequate for some applications, it is desirable to utilize a circuit having fewer components, lower cost, enhanced noise immunity, and more reliable signal detection at minimum cranking speeds.

SUMMARY OF THE INVENTION

The present invention relates to a signal processing circuit with a comparator having a fixed and a variable reference input. The comparator circuit is for detection of a positive quasi-sinusoidal waveform pulse. The signal detection circuit includes a low pass input filter, a voltage input clamp, a variable detection threshold, and a zero crossing detector. The circuit produces an approximately square wave output based upon the positive pulse of a quasi-sinusoidal waveform received, for example, from a variable reluctance (VR) sensor. The circuit may be used as a positive to negative zero crossing detector having detection armed by a variable threshold of the positive quasi-sinusoidal pulse, thus providing variable noise immunity and a fixed phase relationship between the input and output signal for an input signal having a variable amplitude.

An exemplary signal detection circuit includes a single comparator and various discrete components to provide the above-stated signal processing. The input signal is provided to the inverting input of the comparator through a low pass filter network, for example a three-stage filter having an LC filter formed by the coil of the VR sensor and a capacitor, and a two-stage RC filter formed by series resistors and parallel capacitors. The input signal may also be provided through a diode voltage clamp which limits the input signal to within the common mode range of the comparator. Additionally, the input signal may be biased to approximately mid-range of the common mode range of the comparator.

The exemplary signal detection circuit includes a variable threshold voltage reference coupled to the noninverting input of the comparator. The variable reference adapts the positive threshold based on the frequency of the input signal, providing a higher threshold at higher frequencies and a lower threshold at lower frequencies, for example, slow cranking engine start speeds. Advantageously, a variable threshold provides increased noise immunity as the amplitude of the input signal received from a VR sensor increases with frequency. Additionally, by adjusting the threshold, the phase relationship between the input and output signal of the detection circuit can be maintained for a signal of variable amplitude, The low-frequency threshold may be set by a fixed voltage reference coupled to the noninverting comparator input, and the threshold adjusted by a variable reference, for example, a capacitor and diode in series coupled between the comparator output and the noninverting comparator input. This circuit arrangement also provides for AC hysteresis of the output. DC hysteresis may be provided by a feedback resistor coupled between the comparator output and the noninverting input.

To ensure there are no output signal pulses during engine control unit (ECU) power-up regardless of the position of the VR sensor and wheel, the inverting input of the comparator may be held low by an ECU power-up signal. The circuit configuration also requires a positive-to-negative transition of the input signal before providing an output upon the input signal exceeding the variable threshold. The output signal provides an approximately square negative pulse that begins upon the conditioned input signal exceeding the variable threshold and that ceases upon the conditioned input making a positive-to-negative or zero crossing transition.

In one form thereof, the present invention provides a signal processing circuit, including a voltage comparator having an inverting comparator input, a noninverting comparator input and a comparator output; a reference voltage circuit having a fixed voltage reference coupled to the noninverting comparator input and a variable voltage reference coupled to the noninverting comparator input; and an input circuit coupled to the inverting comparator input and adapted to receive an input signal.

In another form thereof, the present invention provides a signal processor for processing an input signal, the signal processor including a voltage comparator having an inverting comparator input, a noninverting comparator input and a comparator output; a variable threshold reference circuit coupled to the noninverting comparator input and driven by at least the comparator output; and a low pass filter coupling the input signal to the inverting comparator input.

In yet another form thereof, the present invention provides a signal processor for processing an input signal, including a circuit having a single comparator and associated discrete components, the circuit capable of receiving a quasi-sinusoidal waveform and outputting an approximately square waveform pulse substantially coinciding with the positive to negative zero crossing of the quasi-sinusoidal waveform, and the circuit having a threshold for providing the approximately square waveform pulse that increases with increasing frequency of the input signal.

BRIEF DESCRIPTION OF THE DRAWINGS

The present invention will now be described, by way of example, with reference to the accompanying drawings, in which.

Figure 1:
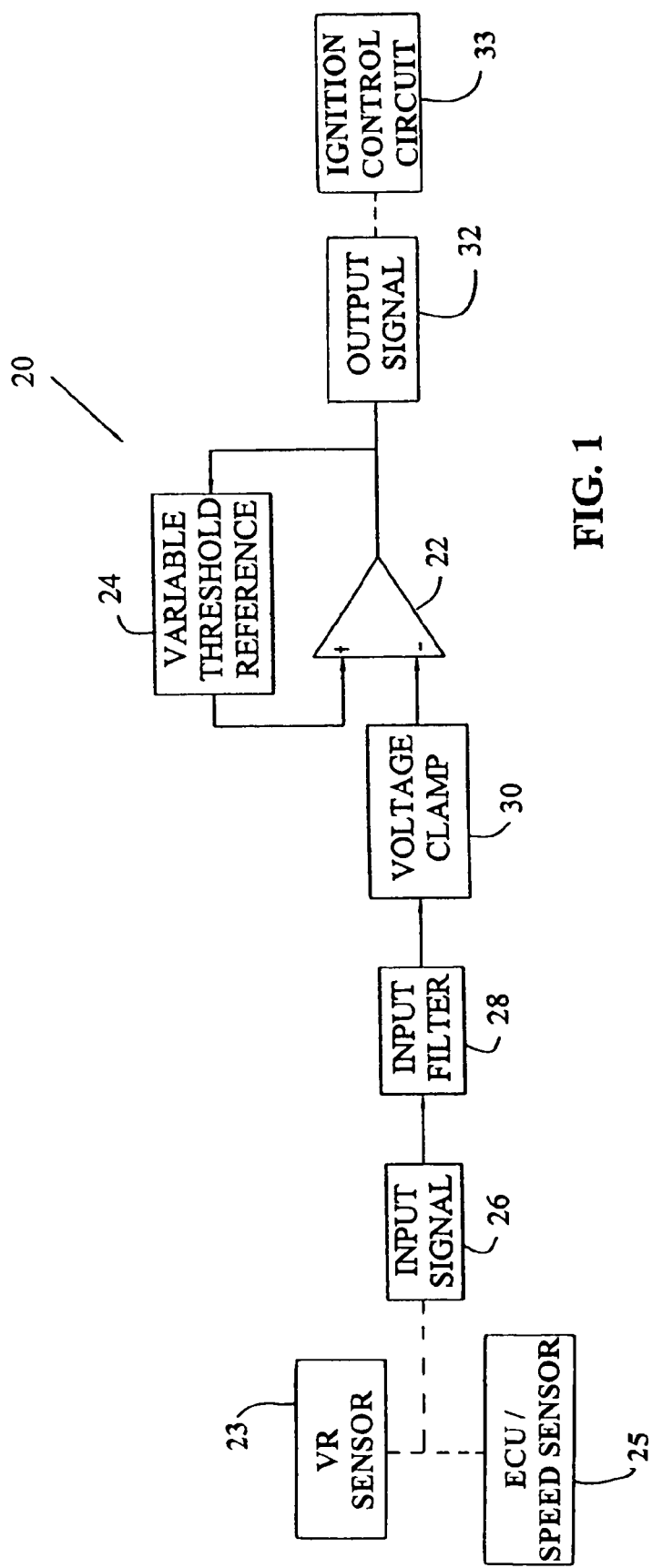
FIG. 1 is a block schematic diagram of an exemplary signal detection circuit according to the present invention.

Corresponding reference characters indicate corresponding parts throughout the several views. Although the drawings represent embodiments of the present invention, the drawings are not necessarily to scale and certain features may be exaggerated in order to better illustrate and explain the present invention. The exemplifications set out herein illustrate embodiments of the invention and such exemplifications are not to be construed as limiting the scope of the invention in any manner.

DESCRIPTION OF INVENTION

The embodiments disclosed below are not intended to be exhaustive or limit the invention to the precise forms disclosed in the following detailed description. Rather, the embodiments are chosen and described so that others skilled in the art may utilize their teachings.

Referring to FIG. 1, exemplary signal detection circuit 20 provides signal processing of a quasi sinusoidal waveform, for example, a signal received from a variable reluctance (VR) sensor 23 and an associated speed sensor electronic control unit (ECU) 25 used for detecting engine speed and position and used as a reference for an engine ignition signal. Exemplary circuit 20 provides an approximately square negative output pulse (active low) corresponding to the positive to negative zero crossing of a quasi-sinusoidal waveform component of input signal 26.

Output signal 32 of exemplary circuit 20 is a normally high output signal which is switched low upon a positive input pulse at the inverting input of comparator 22 exceeding the variable threshold reference 24 which is coupled to the noninverting input of comparator 22. Output signal 32 is switched to its high state again upon the zero crossing of a positive-to-negative transition of input signal 26. The transition from low to high of output signal 32 is the portion of the signal that an associated engine control unit (ECU) 33 uses to verify camshaft rotation speed and timing. The transition from low to high corresponds to a notch in the wheel (not shown) sensed by the VR sensor 23, providing a positive to negative zero crossing in input signal 26.

Exemplary circuit 20 includes comparator 22 having variable threshold reference 24 coupled to the noninverting input. Comparator 22 may receive input signal 26 through conditioning elements, for example, low-pass input filter 28 and voltage clamp 30.

In order to provide proper system timing, for example, to verify camshaft timing or to drive sparkplugs of an automotive engine, the lag time between input signal 26 and output signal 32 is kept to a minimum to meet ignition system timing requirements, and variable threshold reference 24 provides a lower detection threshold at minimum engine cranking speeds and a higher threshold reference at higher engine speeds, therefore maximizing noise immunity and providing a substantially constant phase relationship between input signal 26 and output signal 32. Additionally, noise immunity is provided by various elements of exemplary circuit 20.

Figure 2:
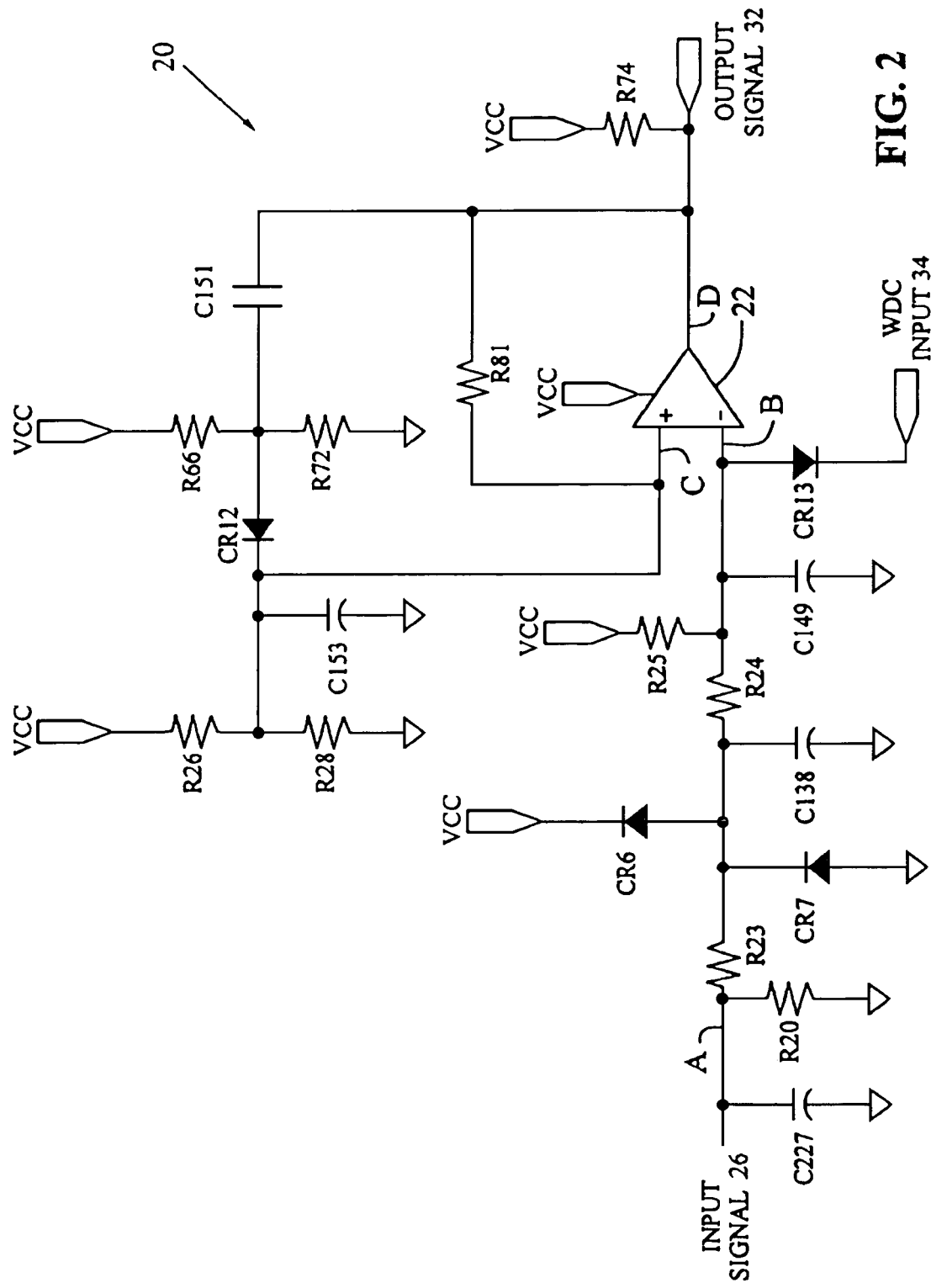
FIG. 2 is a schematic diagram of the exemplary signal detection circuit of FIG. 1.

FIG. 2 shows a schematic diagram of exemplary signal detection circuit 20. Circuit 20 receives input signal 26, for example, a quasi-sinusoidal waveform from a VR sensor 23, and provides output signal 32, for example, to an ECU. While output signal 32 may be configured to be a normally high or low output signal, exemplary circuit 20 includes pull-up resistor R74 coupled with the open collector stage output of comparator 22, thereby providing output signal 32 as a normally high output signal.

Input signal 26 may be conditioned rather than being directly coupled to the inverting input of comparator 22. Exemplary circuit 20 includes a three-stage low-pass filter, voltage clamp, and voltage bias. Specifically, the VR sensor 23 and capacitor C227 form a first-stage low-pass filter. Resistor R23 and capacitor C138 form a second-stage low-pass filter. Resistor R24 and capacitor C149 form a third-stage low-pass filter. Various circuit 20 components were selected in order to provide a maximum frequency of input signal 26 of 240 hertz, which corresponds to a high engine speed of 7200 rpm. The first-stage low-pass filter of the VR sensor 23 and capacitor C227 provide two poles centered around approximately 1.75 kilohertz. The second and third-stage low-pass filter formed by resistors R23 and R24 and capacitors C138 and C149 provide two additional poles that are approximately 1.75 kilohertz. The input filter configuration advantageously provides approximately 60 dB/decade of attenuation at greater than approximately 7 times the designed maximum input frequency.

Input conditioning of input signal 26 also includes biasing input signal 26 to approximately 2.49 volts. Specifically, series resistors R23 and R24, and parallel resistor R25 which is coupled to the positive voltage supply of 5 volts, provides the desired bias voltage to approximately mid-range of the common mode range of comparator 22.

Voltage clamp 30 (FIG. 1) includes diodes CR6, the cathode of which is coupled to the positive voltage supply and the anode of which is coupled to the input signal path, and CR7, the anode of which is coupled to ground and the cathode of which is coupled to the input signal path. Diodes CR6 and CR7 provide clamping of input signal 26 between approximately −0.5 volts and +5.5 volts. The voltage clamping ensures that the signal coupled to the inverting input of comparator 22 remains within the common mode range of comparator 22.

Variable threshold reference 24 (FIG. 1) of exemplary circuit 20 includes a fixed voltage reference and a variable voltage reference that adapts to the frequency of input signal 26. Specifically, the fixed voltage threshold reference provided to the noninverting input of comparator 22 is set by a voltage divider network formed from resistors R26 and R28. Resistors R26 and R28 are connected in series between the positive voltage supply and ground, and the node connecting resistors R16 and R28 is coupled across parallel capacitor C153 to the noninverting input of comparator 22. The fixed threshold is therefore set to approximately 2.54 volts in addition to the DC hysteresis provided by resistor R81. Resistor R81 is coupled between the noninverting input and the output of comparator 22 and provides approximately 0.08 volts of additional threshold reference.

The variable threshold reference which adapts to the frequency of input signal 26 is provided by the configuration of resistors R66 and R72, diode CR12, and capacitor C151. As shown in FIG. 2, diode CR12 is configured with the cathode coupled to the noninverting input of comparator 22 and the anode coupled in series with capacitor C151 which is coupled to the output of comparator 22. The voltage dividing network formed by resistors R66 and R72 is coupled in series between the positive voltage supplying ground and also coupled between resistors R66 and R72 to the anode of diode CR12.

Upon output signal 32 transitioning to a high state, capacitor C151 is charged through pull-up resistor R74, thereby providing AC hysteresis by providing current through diode CR12 and increasing the voltage threshold reference at the noninverting input of comparator 22. After the output of comparator 22 switches to a low state, driving output signal 32 low, capacitor C151 discharges and the voltage at the anode of diode CR12 may drop below ground. However, because diode CR12 blocks the flow of current from the voltage divider network of resistors R26 and 28, hysteresis through CR12 is eliminated and the voltage threshold reference at the noninverting input of comparator 22 remains no lower than the fixed voltage threshold reference of approximately 2.54 volts set by resistors R26 and R28. Thus, the threshold for positive to negative zero crossing detection is not dependent on the frequency of input signal 26 or the resulting variable threshold for positive transitioning pulse detection.

Figure 3:
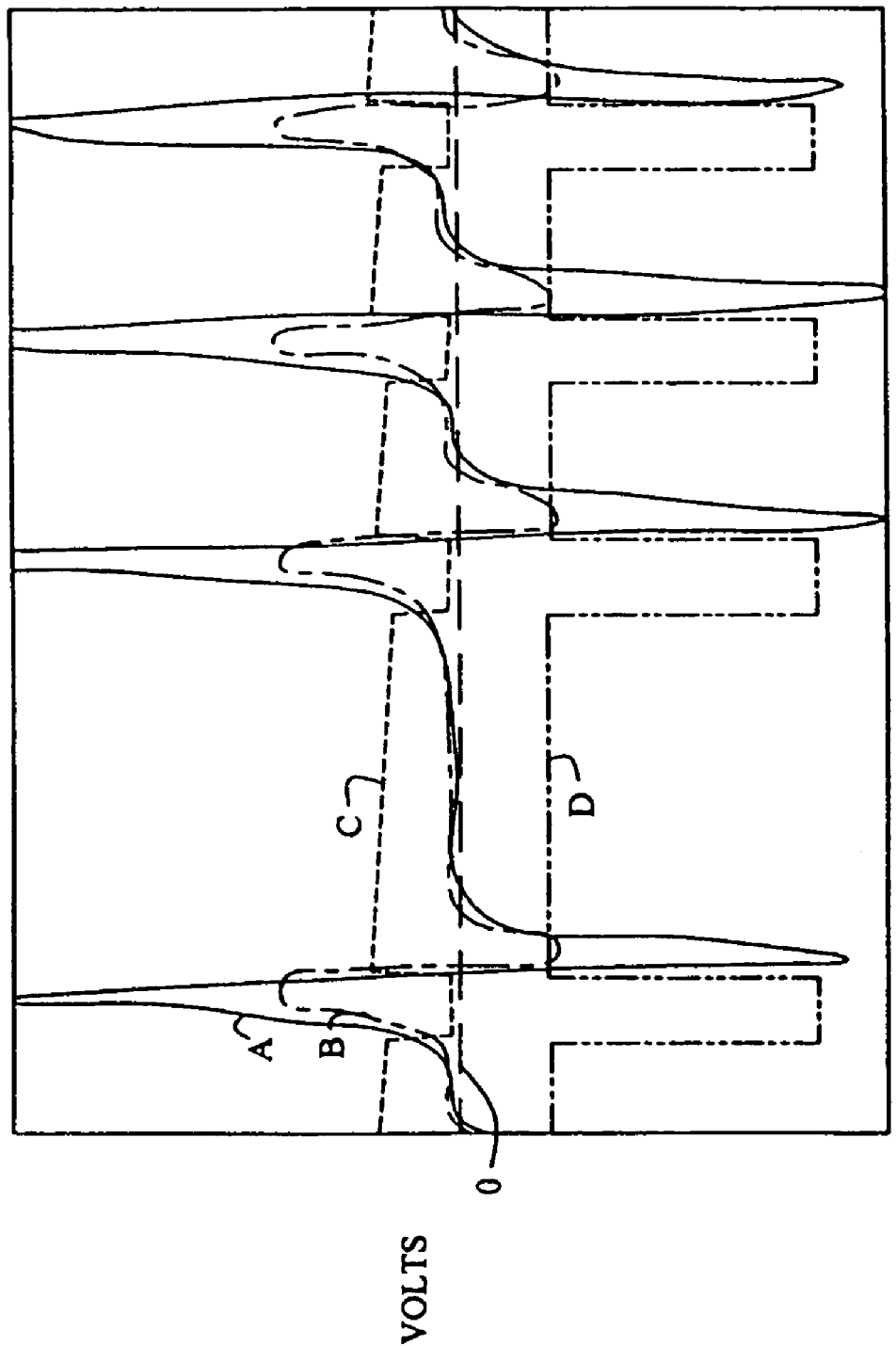
FIG. 3 is a graphical illustration of the signals associated with the exemplary signal detection circuit of FIG. 1.

Referring to FIG. 3, the approximate amplitude of various signals associated with exemplary circuit 20 are shown along a timeline formed by the X-axis. Input signal 26 of exemplary circuit 20 is depicted as signal A in FIG. 3. The conditioned input signal coupled to the inverting input of comparator 22 is depicted as signal B in FIG. 3. The variable voltage threshold reference coupled to the noninverting input of comparator 22 is depicted as signal C. Output signal 32 provided by the output of comparator 22 is depicted as signal D.

As shown in FIG. 3, as signal B exceeds the variable threshold level of signal C provided to the noninverting input of comparator 22, comparator 22 changes state, driving output signal 32 to an active low state. Upon signal B, the conditioned input signal 26, transitioning from positive to negative zero crossing, signal B falls below the level of variable voltage threshold signal C, causing comparator 22 to again change state, thereby providing a high state to output signal 32. As can be noted between the positive pulses of signals A and B, variable voltage threshold signal C decays over time as capacitor C151 discharges, thereby providing a lower threshold level as the frequency of input signal 26 decreases.

The variable threshold, signal C, is determined in part by the time available for C151 to discharge before a positive transitional pulse of signal B is received. Note that signal C, the threshold for switching of comparator 22, is fixed at a lower voltage level after the positive transitioning pulse of signal B until the positive to negative zero crossing of signal B. This transition of signal C from a variable threshold for a positive transitioning pulse to a fixed threshold for a positive to negative zero crossing is provided by rapid discharge of capacitor C151 upon the output of comparator 22, signal D, switching low, therefore reversing current flow and blocking the flow of current through diode CR12 to the non-inverting input of comparator 22.

Figure 4:
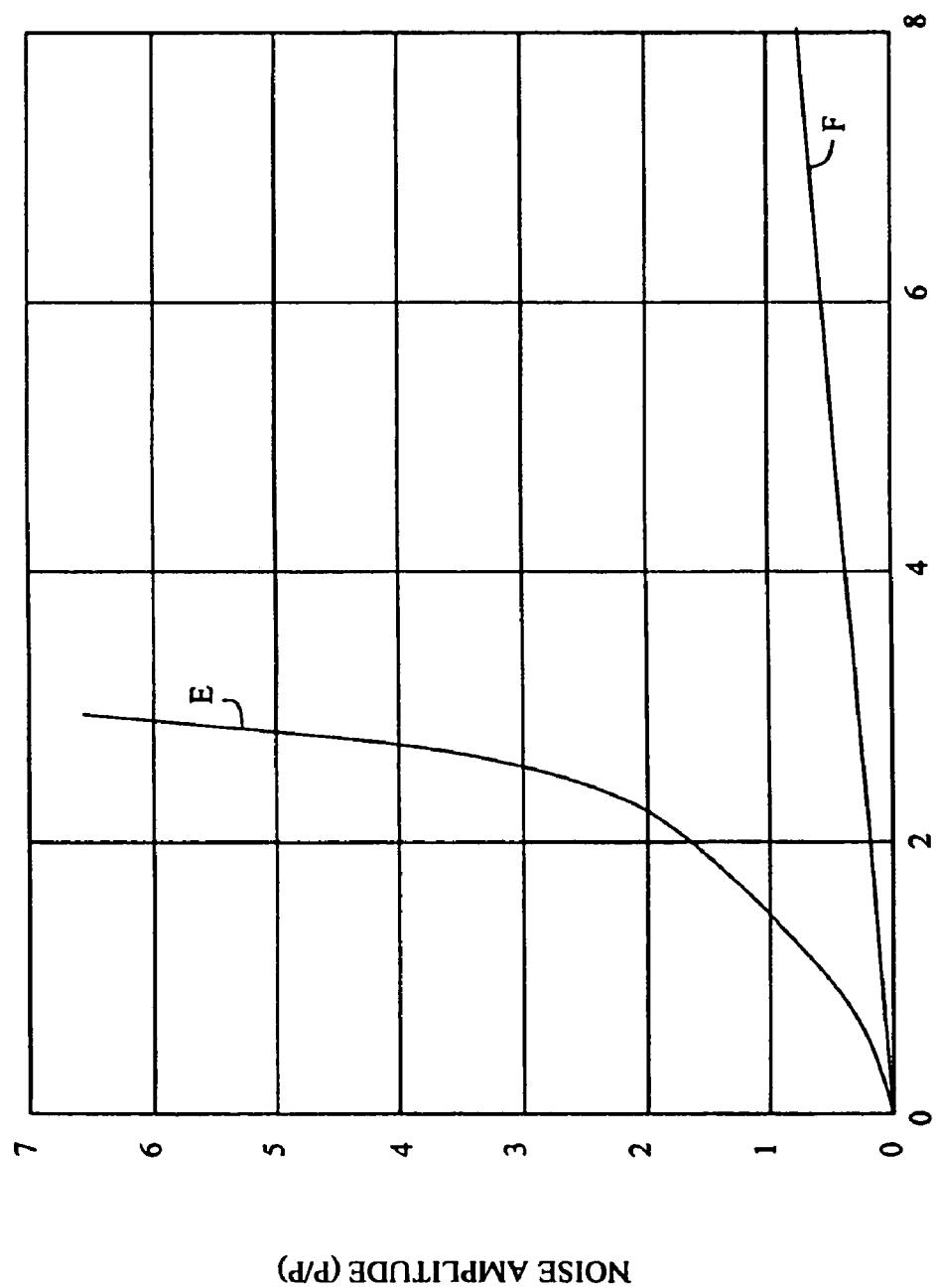
FIG. 4 is a graphical illustration of the noise immunity of the exemplary signal detection circuit of FIG. 1 and a prior art circuit of FIG. 5.
Figure 5:
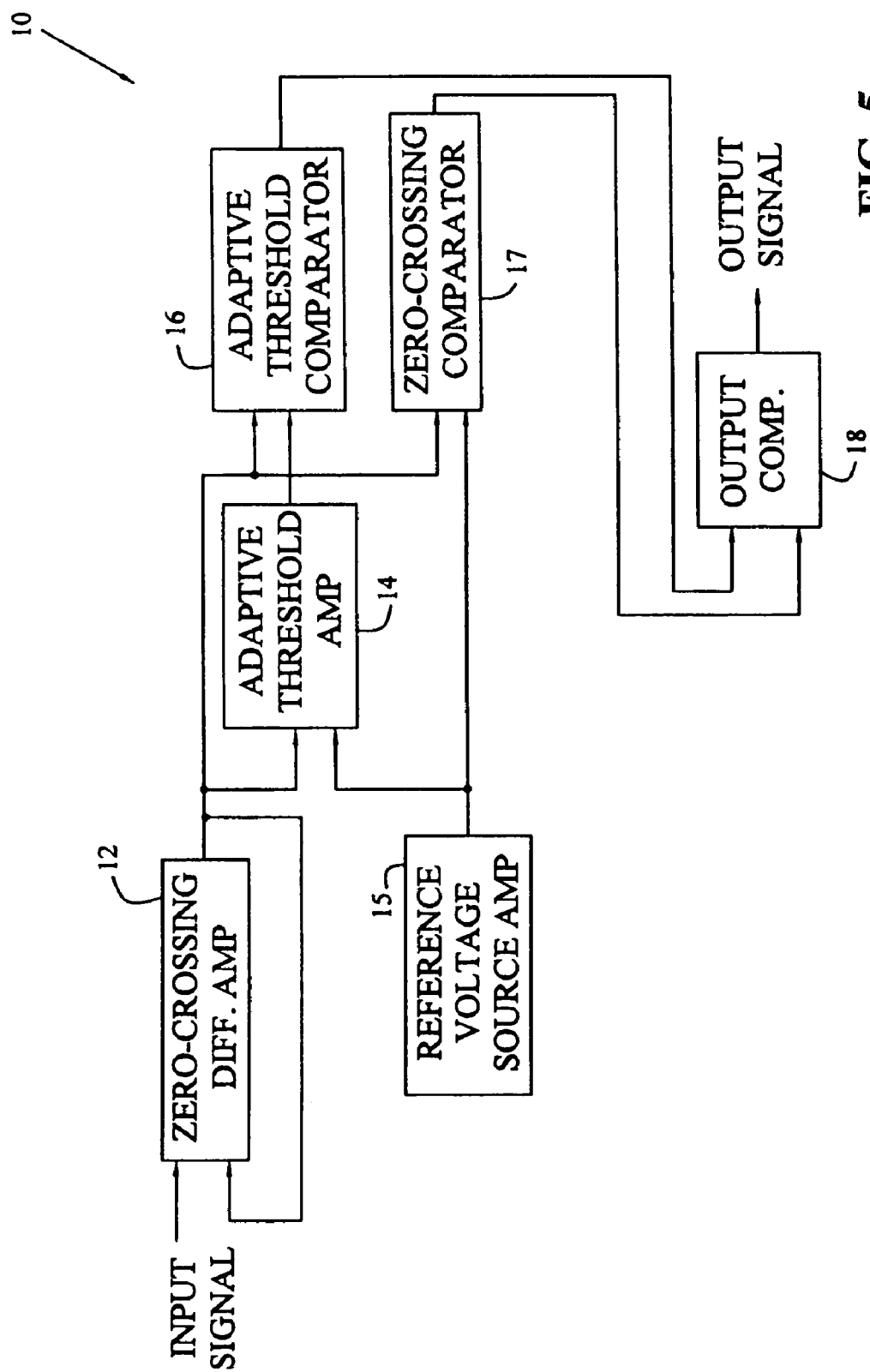
FIG. 5 is a block schematic diagram of a prior art signal detection circuit.

Upon power-up of exemplary signal detection circuit 20 and the ECU 33, WDC input 34, which is provided to the cathode of diode CR13, the anode of which is coupled to the inverting input of comparator 22, is pulled to a low level by the ECU, thereby forcing a high state for output signal 32. Upon the ECU completing power-up such that the positive voltage supply is in regulation, WDC input 34 transitions to the high state allowing signal B, the conditioned input signal 26, to drive the input of inverting input of comparator 22. Referring to FIG. 4, curve E depicts the peak-to-peak noise amplitude threshold versus frequency of exemplary signal detection circuit 20, and curve F depicts the peak-to-peak noise amplitude threshold versus frequency of the prior known circuit 10 of FIG. 5. As shown in FIG. 5, the noise immunity of the present inventive exemplary circuit 20 is clearly superior to prior art circuit 10 across a wide frequency range.

Although described in the exemplary embodiments, it will be understood that various modifications may be made to the subject matter without departing from the intended and proper scope of the invention. Accordingly, it will be understood that other embodiments may fall within the scope of this invention, which is defined by the appended claims.

The invention claimed is:

1. A signal processing circuit comprising:
   a voltage comparator having an inverting comparator input, a noninverting comparator input and a comparator output;
   a reference voltage circuit having a fixed voltage reference coupled to said noninverting comparator input and a variable voltage reference coupled to said noninverting comparator input and not said inverting comparator input; and
   an input circuit coupled to said inverting comparator input and adapted to receive an input signal,
   wherein said variable voltage reference comprises a capacitor and a diode, said capacitor coupled between said comparator output and the anode of said diode, and the cathode of said diode coupled to said noninverting comparator input.

2. The signal processing circuit of claim 1, wherein said fixed voltage reference includes a resistive voltage divider.

3. The signal processing circuit of claim 1, wherein said variable voltage reference further comprises a resistive voltage divider coupled to said anode of said diode.

4. The signal processing circuit of claim 3, wherein said resistive voltage divider and said capacitor are sized such that a reference signal amplitude provided to said noninverting comparator input increases as the frequency of said input signal increases.

5. The signal processing circuit of claim 1, wherein said input signal is provided by a variable reluctance sensor.

6. The signal processing circuit of claim 1, wherein said input signal is provided by an engine speed sensor.

7. The signal processing circuit of claim 6, wherein said comparator output is coupled to an engine ignition control circuit.

8. A signal processing circuit comprising:
   a voltage comparator having an inverting comparator input, a noninverting comparator input and a comparator output;
   a reference voltage circuit having a fixed voltage reference coupled to said noninverting comparator input and a variable voltage reference coupled to said noninverting comparator input; and
   an input circuit coupled to said inverting comparator input and adapted to receive an input signal,
   wherein said variable voltage reference comprises a capacitor and a diode, said capacitor coupled between said comparator output and the anode of said diode, and the cathode of said diode coupled to said noninverting comparator input, and said input circuit further comprises a low pass filter.

9. A signal processing circuit comprising:
   a voltage comparator having an inverting comparator input, a noninverting comparator input and a comparator output;
   a reference voltage circuit having a fixed voltage reference coupled to said noninverting comparator input and a variable voltage reference coupled to said noninverting comparator input; and
   an input circuit coupled to said inverting comparator input and adapted to receive an input signal,
   wherein said variable voltage reference comprises a capacitor and a diode, said capacitor coupled between said comparator output and the anode of said diode, and the cathode of said diode coupled to said noninverting comparator input, and said input circuit further comprises a voltage clamp.

10. A signal processing circuit comprising:
    a voltage comparator having an inverting comparator input, a noninverting comparator input and a comparator output;
    a reference voltage circuit having a fixed voltage reference coupled to said noninverting comparator input and a variable voltage reference coupled to said noninverting comparator input; and
    an input circuit coupled to said inverting comparator input and adapted to receive an input signal,
    wherein said variable voltage reference comprises a capacitor and a diode, said capacitor coupled between said comparator output and the anode of said diode, and the cathode of said diode coupled to said noninverting comparator input, and further comprising a resistor coupled between said comparator output and said noninverting comparator input, said resistor sized to provide DC hysteresis for said comparator output.

11. A signal processing circuit comprising:
    a voltage comparator having an inverting comparator input, a noninverting comparator input and a comparator output;
    a reference voltage circuit having a fixed voltage reference coupled to said noninverting comparator input and a variable voltage reference coupled to said noninverting comparator input; and
    an input circuit coupled to said inverting comparator input and adapted to receive an input signal,
    wherein said variable voltage reference comprises a capacitor and a diode, said capacitor coupled between said comparator output and the anode of said diode, and the cathode of said diode coupled to said noninverting comparator input, and said comparator output is an open collector stage output.

12. A signal processor for processing an input signal, the signal processor comprising:
    a voltage comparator having an inverting comparator input, a noninverting comparator input and a comparator output;
    a variable threshold reference circuit coupled to said noninverting comparator input and driven by at least said comparator output;
    a low pass filter coupling the input signal to said inverting comparator input; and
    a voltage clamp coupling the input signal to said inverting comparator input, said voltage clamp limiting the signal received by said inverting comparator input to the common mode range of said comparator,
    wherein said variable threshold reference circuit comprises:
    a capacitor coupled at a first end to said comparator output;
    a diode having an anode coupled to a second end of said capacitor and a cathode coupled to said noninverting comparator input;
    a first resistive voltage divider coupled to said second end of said capacitor; and
    a second resistive voltage divider coupled to said noninverting comparator input.

13. The signal processor of claim 12, wherein said variable threshold reference circuit provides a voltage signal to said noninverting comparator input that increases as the frequency of the input signal increases.

14. The signal processor of claim 12, wherein said comparator output is an open collector stage output.

15. A signal processing circuit for processing an input signal, said circuit comprising:
a single comparator having an inverting comparator input, a noninverting comparator input and a comparator output;
a reference voltage circuit having a fixed voltage reference coupled to said noninverting comparator input and a variable voltage reference coupled to said noninverting comparator input; and
an input circuit coupled to said inverting comparator input and adapted to receive said input signal,
wherein said variable voltage reference comprises a capacitor and a diode, said capacitor coupled between said comparator output and the anode of said diode, and the cathode of said diode coupled to said noninverting comparator input,
wherein said signal processing circuit is capable of receiving a quasi-sinusoidal waveform and outputting an approximately square waveform pulse substantially coinciding with a positive pulse of said quasi-sinusoidal waveform, and said signal processing circuit having a first threshold portion for providing said approximately square waveform pulse that increases with increasing frequency of the input signal.

16. The signal processor of claim 15, wherein said first threshold portion determines switching of said comparator upon a positive transitioning of the input signal.

17. The signal processor of claim 16, further comprising a fixed second threshold portion for switching of said comparator upon a positive to negative zero crossing of the input signal.

* * * * *